US008737080B2

(12) United States Patent
Zhang et al.

(10) Patent No.: US 8,737,080 B2
(45) Date of Patent: May 27, 2014

(54) MODULAR SURFACE MOUNT PACKAGE FOR A SYSTEM ON A CHIP

(75) Inventors: Yang Zhang, San Diego, CA (US); Yongsheng Peng, San Diego, CA (US); Jack B. Steenstra, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 455 days.

(21) Appl. No.: 13/006,570

(22) Filed: Jan. 14, 2011

(65) Prior Publication Data
US 2012/0182699 A1    Jul. 19, 2012

(51) Int. Cl.
*H05K 1/14* (2006.01)

(52) U.S. Cl.
USPC .............................. 361/742; 361/807; 361/810

(58) Field of Classification Search
USPC ................. 361/742, 758, 770, 804; 439/76.1; 257/777–779
See application file for complete search history.

(56) References Cited

U.S. PATENT DOCUMENTS

| | | | | |
|---|---|---|---|---|
| 4,742,385 | A * | 5/1988 | Kohmoto | 257/697 |
| 5,570,274 | A * | 10/1996 | Saito et al. | 361/784 |
| 5,869,894 | A * | 2/1999 | Degani et al. | 257/723 |
| 6,580,618 | B2 | 6/2003 | Pu | |
| 6,703,697 | B2 * | 3/2004 | Leahy et al. | 257/678 |
| 7,109,574 | B2 | 9/2006 | Chiu et al. | |
| 7,235,880 | B2 * | 6/2007 | Prokofiev | 257/734 |
| 7,619,901 | B2 | 11/2009 | Eichelberger et al. | |
| 7,915,724 | B2 * | 3/2011 | Ha et al. | 257/686 |
| 8,144,479 | B2 * | 3/2012 | Liao et al. | 361/760 |
| 2007/0252283 | A1 | 11/2007 | Keller | |
| 2009/0168386 | A1 | 7/2009 | Suzuki et al. | |
| 2009/0268423 | A1* | 10/2009 | Sakurai et al. | 361/803 |
| 2010/0252936 | A1 | 10/2010 | Imaoka et al. | |

FOREIGN PATENT DOCUMENTS

| | | |
|---|---|---|
| DE | 19816794 A1 | 10/1999 |
| EP | 1128714 A1 | 8/2001 |
| EP | 2001050 A2 | 12/2008 |

OTHER PUBLICATIONS

International Search Report and Written Opinion—PCT/US2012/020985—ISAEPO—May 2, 2012.

* cited by examiner

*Primary Examiner* — Hung S Bui
(74) *Attorney, Agent, or Firm* — Jeffrey J. Jacobs

(57) ABSTRACT

A modular package may be utilized to mount an RF system-on-chip in one of plural configurations, such that the same modular package may be utilized to enable plural device formats, while reducing the amount of RF testing needed to change device formats. In one configuration, a surface mount device is mounted onto a first surface of a board, and the board is directly surface mounted onto a base board. Here, the base board includes a hole for accommodating the surface mount device, providing a thin device format. In a second configuration, a spacer is mounted onto the first surface of the board, such that a gap is provided between the board and the base board for accommodating the surface mount device, providing a relatively thicker device, but providing additional surface area where the hole otherwise would be, reducing the device size.

20 Claims, 6 Drawing Sheets

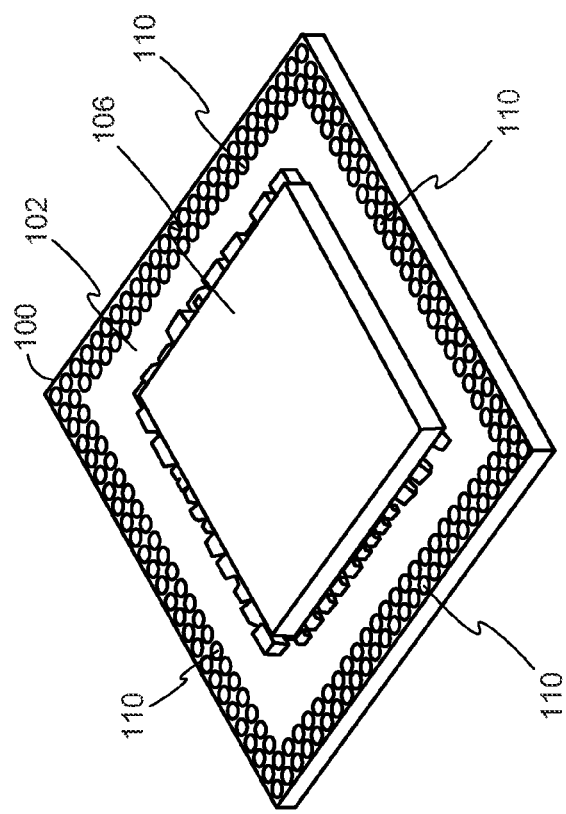
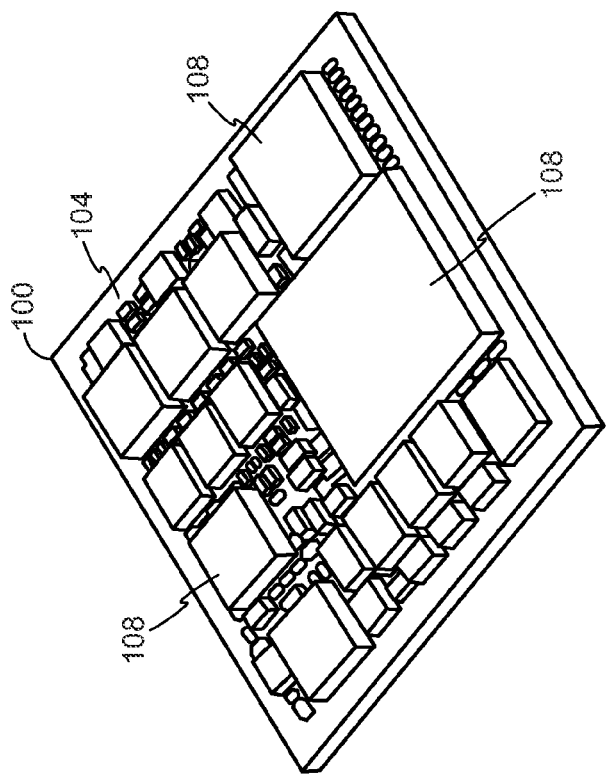
FIG. 1

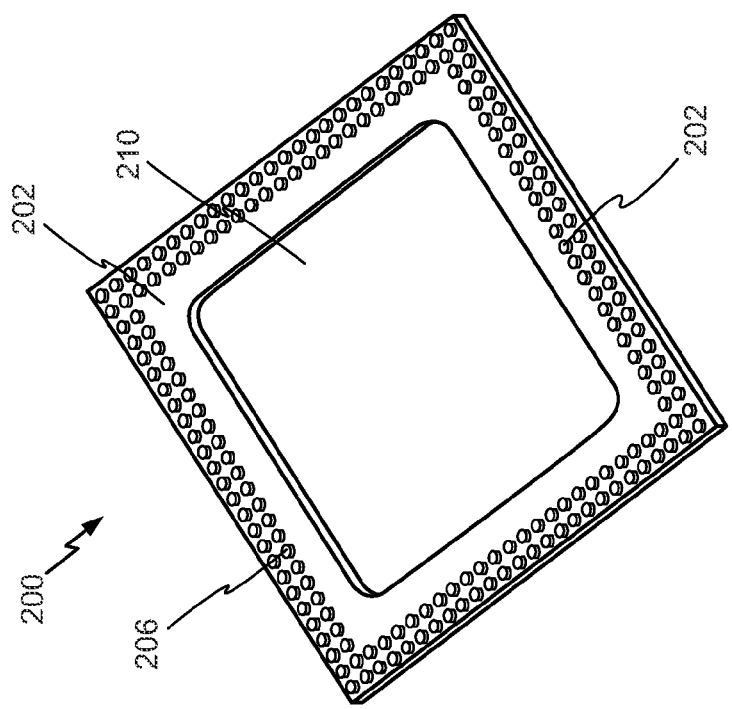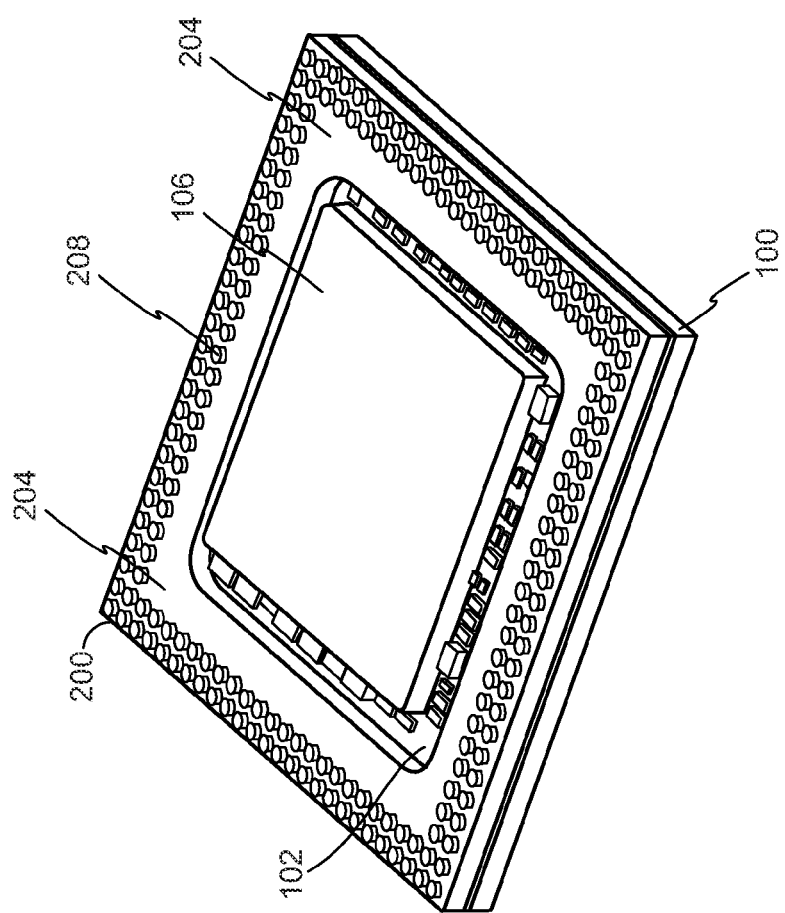
FIG. 2

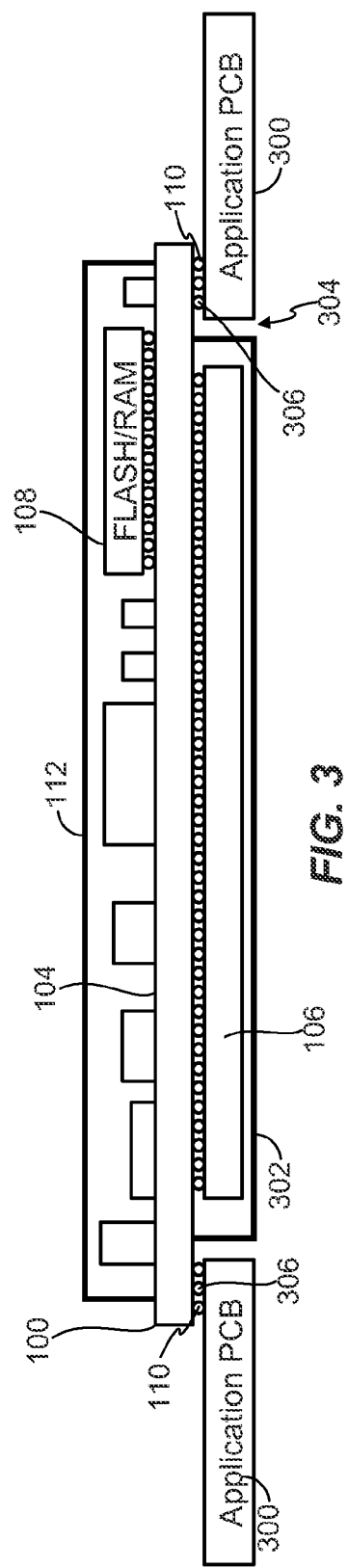
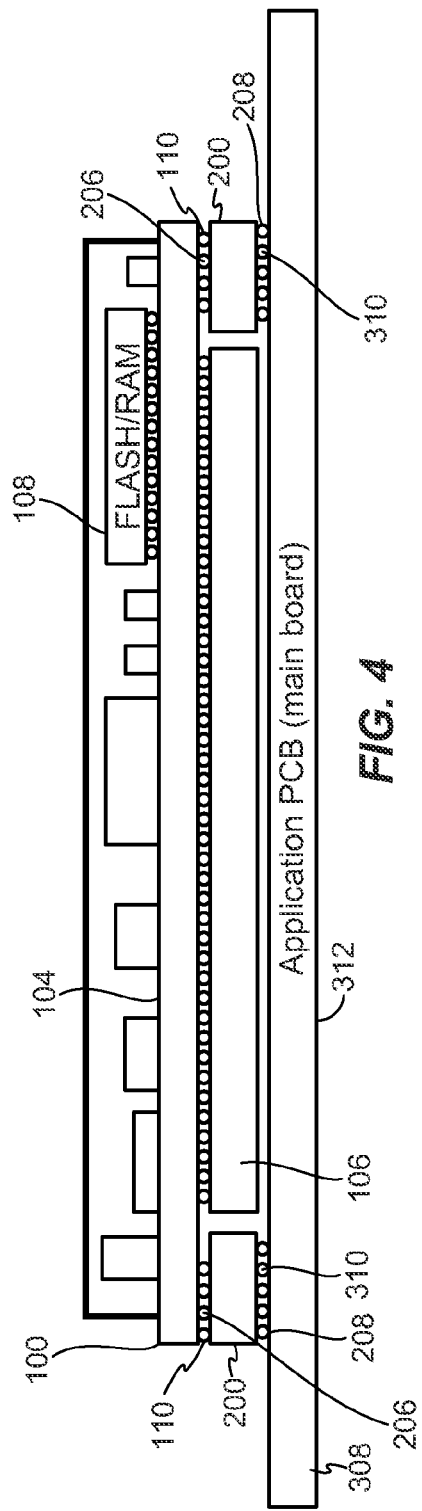

MODULAR SURFACE MOUNT PACKAGE FOR A SYSTEM ON A CHIP

BACKGROUND

1. Field

Aspects of the present disclosure relate generally to electronic circuit packaging, and more particularly, to surface mount packaging for an RF system-on-chip.

2. Background

Currently, the use of surface mount technology for mounting packaged semiconductor devices onto printed circuits boards is well known. Surface mount packaging can provide for a thin profile end device, where the packaged semiconductor device may lay substantially flat on a thin board. In addition, consolidation and integration of multiple modules or devices into a single module such as a system-on-chip has been widely employed.

However, with the proliferation of mobile telecommunications devices, the desire to reduce the thickness and size of a system board has lead to significant developmental effort in the area of device packaging. Further, when a system-on-chip is an RF system such as one to be utilized in a mobile telecommunications device, extensive testing and analysis is frequently required to certify the end device.

Because of the unending desire for small, but unique device designs, there continues to exist a need in the art for improved surface mount packages, especially those that may provide for reduced testing costs and increased versatility.

SUMMARY

In various representative aspects, the present disclosure provides a modular package for mounting a semiconductor system-on-a-chip into a device like a mobile phone. A modular package in accordance with an aspect of the disclosure may be mounted in one of two available configurations. In a first configuration, the module may be directly mounted onto a base board, wherein the base board may include a hole into which any surface mount packages mounted on a first surface of the modular package may be deposited. In a second configuration, a spacer may be mounted onto the modular package. With the spacer, the modular package may be surface mounted onto a base board that does not necessarily include a hole.

In one aspect, the disclosure provides that the configurations of the modular package with and without the spacer may be substantially identical in terms of functionality. In this way, the module is capable of being pre-tested and certified in each of the configurations, such that the decision to change from one configuration to another may not require extensive additional testing.

Another aspect of the disclosure provides that the module directly mounted to the base board without utilizing the spacer maintains a very thin profile, enabling a very thin end device.

Another aspect of the disclosure provides that the module including the spacer and mounted to the base board may be slightly thicker than the first configuration, but because a hole is not required in the base board, it may provide more surface area on an opposite side of the base board for the mounting of additional devices, enabling a smaller area device that may not be as thin as the first configuration. Here, the base board may function as RF shielding over the electronic components of the module.

In one example, a modular package may include a board having a first surface and a second surface opposing the first surface. The first surface may include a plurality of connection pads located at a periphery of the board and configured to enable surface mounting of the board. The board and the connection pads may be configured to enable direct surface mounting of the modular package onto a base board, as well as to enable surface mounting of the modular package onto the base board utilizing a spacer between the connection pads and the base board.

In another example, an apparatus may include means for directly mounting an integrated system-on-chip, having at least one surface mount device on a first surface of a board, onto a surface of a base board, such that the at least one surface mount device is in a hole in the base board. The apparatus may further include means for providing a gap between the surface of the base board and the at least one device such that the at least one surface mount device is in the gap when the integrated system-on-chip is mounted onto the surface of the base board without the hole in the base board.

In another example, a method of mounting a modular package onto a base board may include coupling a spacer to a first surface of the modular package, and coupling the spacer to a first surface of the base board, such that the spacer forms a gap between the first surface of the modular package and the first surface of the base board for accommodating at least one surface mount device mounted on the first surface of the modular package. Here, the modular package may be further configured for directly mounting onto a second base board having a hole for accommodating the at least one surface mount device mounted on the first surface of the modular package, without utilizing the spacer.

These and other aspects are more fully comprehended upon review of this disclosure.

BRIEF DESCRIPTION OF THE DRAWINGS

FIG. 1 is a perspective view of surfaces of a modular surface mount package for a system on a chip in accordance with an aspect of the disclosure.

FIG. 2 is a perspective view of a spacer and a modular surface mount package for a system on a chip utilizing the spacer in accordance with an aspect of the disclosure.

FIG. 3 is a cross-sectional view of a modular surface mount package for a system on a chip mounted onto a base board without utilizing a spacer in accordance with an aspect of the disclosure.

FIG. 4 is a cross-sectional view of a modular surface mount package for a system on a chip mounted onto a base board with a spacer in accordance with an aspect of the disclosure.

DETAILED DESCRIPTION

Figure 5:
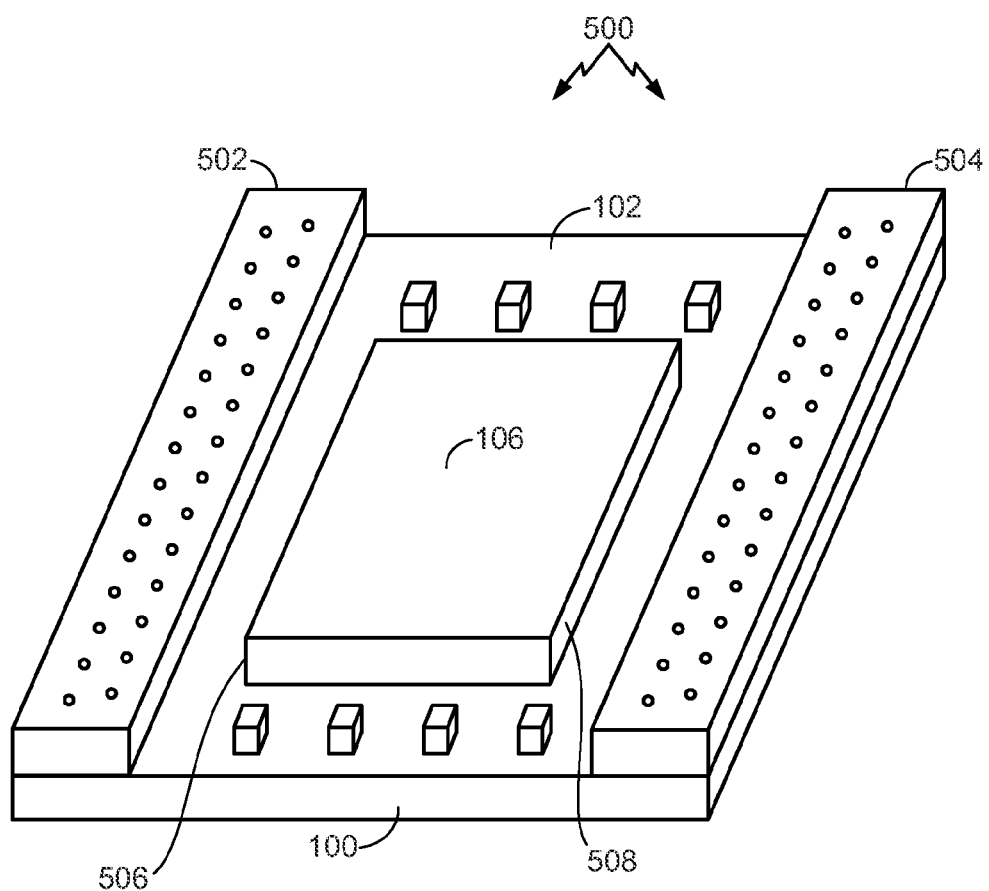
FIG. 5 is a perspective view of a modular surface mount package utilizing a spacer with two segments in accordance with an aspect of the disclosure.

In the following detailed description, only certain examples of the present invention are shown and described, by way of illustration. As those skilled in the art would recognize, the invention may be embodied in many different forms and should not be construed as being limited to the examples set forth herein, but rather, to broadly include the features set forth throughout the instant specification. In the context of the present specification, when an element is referred to as being "on" another element, it can be directly on the other element or be indirectly on the other element with one or more intervening elements interposed therebetween. Also, in the context of the present specification, when an element is referred to as being "connected" or "coupled" to another element, it can be directly connected or coupled to the other element or be indirectly connected or coupled to the other element with one or more intervening elements interposed therebetween. Like reference numerals designate like elements throughout the specification.

FIG. 1 is a perspective diagram of a modular package for mounting a system-on-a-chip into a larger module. In the illustrated example, the module includes one or more surface mount devices 106 mounted to a first surface 102 of a first board 100, with one or more surface mount devices 108 optionally mounted on a second surface 104 of the first board 100. The surface mount devices 108 may be accompanied by, or replaced with, through-hole mounted devices, or may be eliminated in some aspects of the disclosure.

The first board 100 may be a printed circuit board (PCB) or any other suitable board for mechanically supporting various devices such as surface mount packages to one or more of its surfaces, and may include wires, routing, traces, vias, ground planes, and/or any other suitable mechanisms for electrically coupling various devices mounted to the first board 100. Further, the first board 100 may include any suitable number of layers, from zero or more, between the first surface 102 and the second surface 104.

The first surface 102 of the first board 100 may include surface mount connection pads 110 such as at least one ball grid array (BGA) at its periphery. For example, the connection pads 110 may be located at or near one or more edges of the first board 100. These connection pads 110 are generally electrically coupled through wires or traces to various pins or connection pads on the various surface mount devices 106 and 108 mounted to the respective first 102 and second 104 surfaces of the first board 100, for interfacing one or more of those devices with external devices or modules.

When mounting the modular package without utilizing a spacer, as illustrated in FIG. 1, an RF shield 112 (see FIG. 3) may be utilized to cover the various surface mount devices 108 mounted on the second surface 104 of the first board 100 to prevent EMI (electromagnetic interference) and EMC (electromagnetic compatibility).

FIG. 2 is a perspective diagram of one example of a spacer 200 and how it may be mounted onto the modular package. The spacer 200 in this example includes a first surface 202 and a second surface 204 opposed to the first surface 202, with each of the first 202 and second 204 surfaces including connection pads 206, 208 on the respective surfaces 202, 204. In the illustrated example, the spacer 200 has a form similar to that of a picture frame, with a hole 210 in a central region and having the connection pads located around a periphery of their respective surfaces. The spacer 200 may be a PCB or any suitable board configured to enable structural support of the first board 100 and electrical coupling between the first board 100 and a base board onto which the first board 100 can be mounted. Further, the spacer 200 may include wires, routing, traces, vias, ground planes, and/or any other suitable mechanisms for electrically coupling various elements such as the connection pads 206 and 208.

When the modular package utilizes the spacer 200, an RF shield is not required to cover the surface mount devices 106 on the first surface 106 of the first board 100, because the base board that the module is to be mounted onto may function as the RF shield.

Referring now to FIG. 3, in one configuration, the modular package may be directly mounted onto a base board 300 without the use of the spacer 200. Here, the base board 300 includes a hole 304 such that the surface mount device 106 mounted to the first surface 102 of the first board 100 settles into the hole 304. That is, the base board 300 includes connection pads 306 such as a BGA that are adapted to be electrically coupled, e.g., soldered to the connection pads 110 on the first board 100, and wires or traces to the external devices or modules electrically coupled to the connection pads 306 by way of the base board 300. Because the surface mount device 106, which is deposited into the hole 304, may be an RF device, or may be sensitive to RF interference, in an aspect of the disclosure an RF shield 302 may be placed over the surface mount device 106 so that it may provide RF shielding.

This configuration illustrated in FIG. 3 provides for a thin profile, wherein the total thickness of the entire module (e.g., including the modular package, the base board 300, and any articles mounted thereon) can be as thin as the combined thickness of the base board 300, the first board 100, and any devices mounted on the second surface 104 of the first board 100 such as surface mount devices 108 or any RF shielding 112 that may be utilized to shield the one or more surface mount devices 108. That is, because the one or more surface mount devices 106 mounted on the first surface 102 are settled into the hole 304 in the base board 300, the overall thickness can be reduced.

Referring now to FIG. 4, in another configuration, the spacer 200 may be added to the modular package. So that any surface mount devices 106 may fit between the first board 100 and a base board 308, the spacer 200 may have the same or greater thickness than that of the surface mount devices 106 on the first surface 102 of the first board 100. Unlike the configuration illustrated in FIG. 3, in this configuration, with the spacer 200 in place, the base board 308 onto which the modular package is mounted does not require a hole 304. Thus, the modular package, including the spacer 200, is mounted onto a surface of the base board 308, with the connection pads 208 on the second surface 204 of the spacer 200 are coupled, e.g., soldered to the connection pads 310 on the base board 308. In this second configuration illustrated in FIG. 4, because there is no hole 304 in the base board 308, additional devices can be mounted on a second surface 312, opposite to the mounted modular package.

In the configuration illustrated in FIG. 4, although the thickness may be greater than that of the configuration illustrated in FIG. 3 approximately by the thickness of the spacer 200, a more spatially dense arrangement of devices may be achieved by mounting additional devices to the second surface 312 of the base board 308 where the hole 304 might otherwise be. Thus, utilizing the configuration illustrated in FIG. 4, a reduced size of a device is enabled. Further, the base board 308 itself can act as the RF shield to shield the surface mount devices 106 mounted on the first surface 102 of the first board 100, potentially eliminating the need for a separate RF shield 302 (see FIG. 3).

In the configuration that includes the spacer, the base board may include plating (e.g., a copper ground plane) over the area where the hole was, in order to function as RF shielding over the area of the components of the module so that the RF shield on the module is not required. That is, in the configuration utilizing the spacer 200, the RF shield 302 is not required on the first surface 102 of the board 100 to cover the surface mount devices 106 when the base board 308 includes a suitable copper ground layer over the component area.

In some aspects of the disclosure, the spacer can take other forms different from the picture frame form illustrated in FIG.

Figure 6:
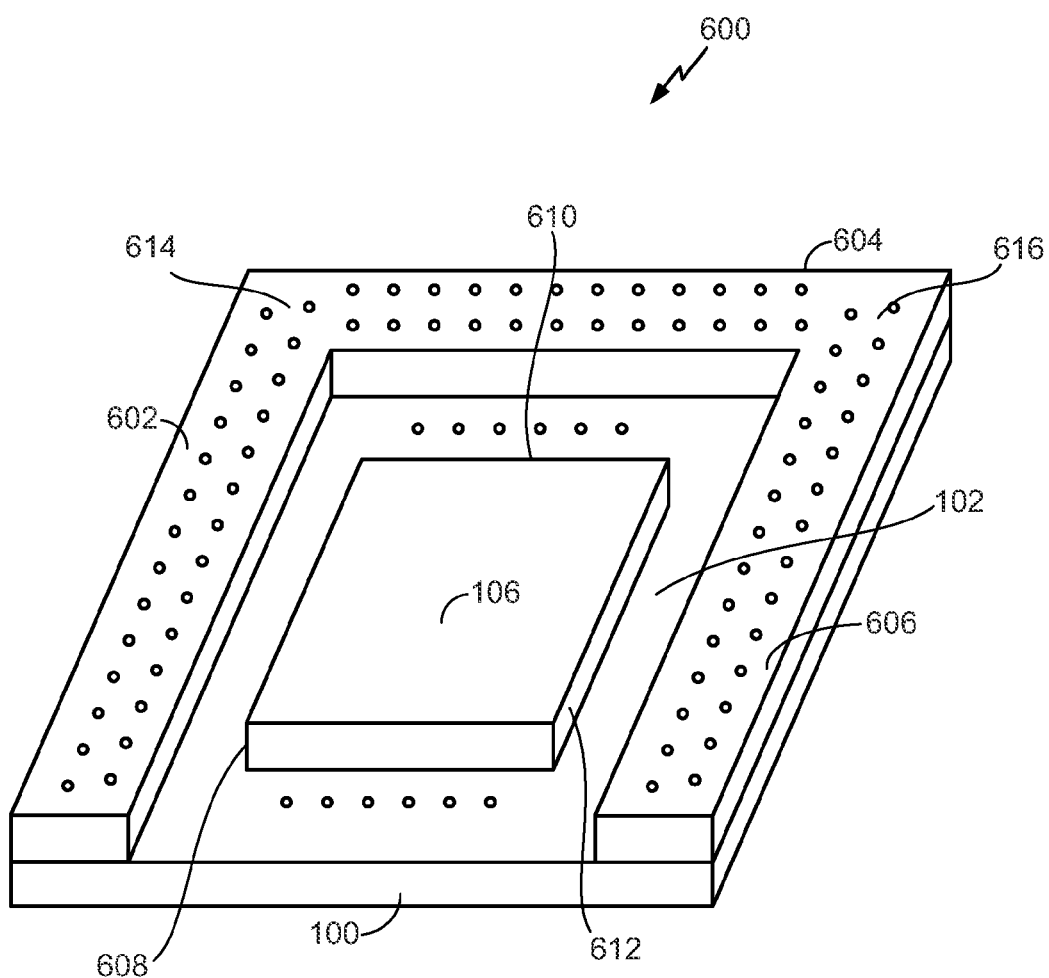
FIG. 6 is a perspective view of a modular surface mount package utilizing a spacer with three segments in accordance with an aspect of the disclosure.

2. In general, any suitable form that would provide structural support for mounting the first board 100 onto the base board 308 in such a way as to provide a gap with adequate space for the one or more surface mount devices 106 between the first board 100 and the base board 308 without necessarily requiring a hole 304 through the base board 308 may be utilized. For example, as illustrated in FIG. 5, the spacer 500 may include a first segment 502 and a second segment 504. Here, each of the first segment 502 and the second segment 504 are configured to be positioned adjacent to opposite edges 506 and 508 of a surface mount device 106 mounted on the first surface 102 of the first board 100. In another example, as illustrated in FIG. 6, the spacer 600 may include a first segment 602, a second segment 604, and a third segment 606, each configured to be positioned adjacent to respective edges 608, 610, and 612 of a surface mount device 106 mounted on the first surface 102 of the first board 100. Here, the first edge 608 is adjacent to the second edge 610, such that the first segment 602 and the second segment 604 are joined at a first corner 614. Similarly, the second edge 610 is adjacent to the third edge 612, such that the second segment 604 and the third segment 606 are joined at a second corner 616. In this way, the first segment 602, the second segment 604, and the third segment 606 generally form a U-shape to surround three sides of the surface mount device 106. In other examples, such spacers may take a form such as, but not limited to, a V-shape or an L-shape, including two segments of a square; a circular shape or one or more portions of a circular shape; or any other suitable shape. Further, the gap between the first board 100 and the base board 308 can take any suitable shape that may accommodate the one or more surface mount devices 106, and may be a closed gap (e.g., wherein segments of the spacer surround all sides of the one or more surface mount devices 106), or an open gap (e.g., wherein one or more sides of the one or more surface mount devices 106 is not adjacent to a segment of the spacer).

Figure 7:
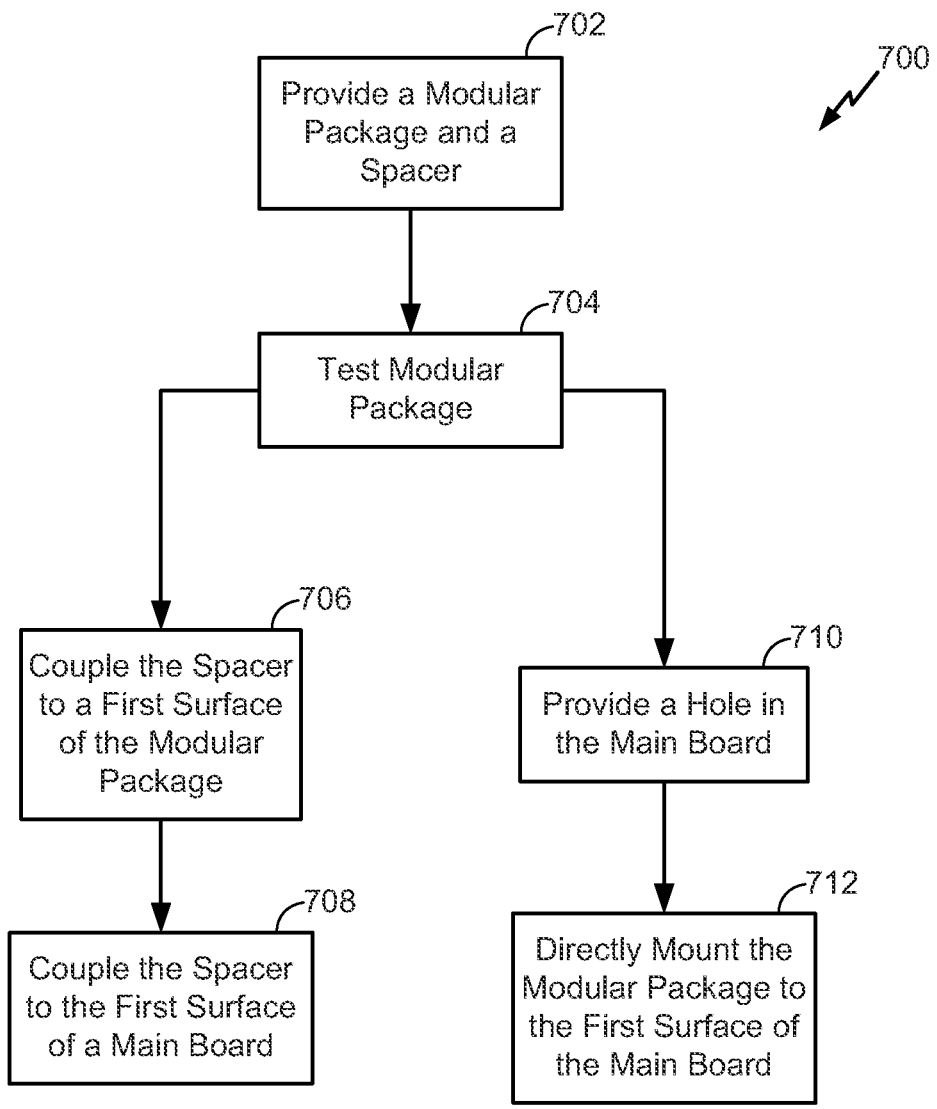
FIG. 7 is a flow chart illustrating a process of mounting a modular surface mount package in accordance with an aspect of the disclosure.

FIG. 7 is a flow chart 700 illustrating a process of mounting a modular package onto a base board in accordance with some aspects of the disclosure. In some aspects, the process may be realized by any number of hardware or software components configured to perform the specified functions and achieve the various results. For example, the various coupling, mounting, and providing processes may be employed, e.g., by an integrated automatic manufacturing system utilizing machinery, flow soldering, robotics, etc.; by an individual utilizing a soldering iron and conventional tools; etc. Further, the testing of the modular package may be employed, e.g., by any suitable testing system including, e.g., a processing system, a communication test set, a spectrum analyzer, or other suitable testing systems as known to those skilled in the art, each of which may carry out a variety of functions. In addition, aspects of the disclosure may be practiced in conjunction with any number of manufacturing and testing processes, and the system described is merely one exemplary application. Further, any number of conventional techniques may be employed for assembly, testing, and the like.

In block 702, the process provides a modular package and a spacer. Here, the modular package may be similar to that illustrated in FIG. 1, including, e.g., at least one surface mount device mounted onto a printed circuit board. In block 704, the modular package may be tested. Here, any suitable testing system may be utilized to test for one or more operational parameters, such as but not limited to RF emission power, interference susceptibility, etc. In block 706, to utilize one configuration, the process couples a spacer to a first surface of the modular package, and in block 708, the process couples the spacer to the first surface of a base board. In this fashion, the modular package can be mounted onto the base board in such a way that a gap exists between the printed circuit board of the modular package, and the base board, to accommodate the at least one surface mount device mounted onto the printed circuit board. Further, one or more devices may be mounted onto an opposing surface of the base board, opposite to the gap, to enable a smaller size of the device as a whole.

In order to utilize a second configuration, in block 710, the process provides a hole in the base board, and in block 712, the process directly mounts the modular package to the first surface of the base board such that the at least one surface mount device mounted onto the printed circuit board is accommodated by the hole in the base board. In this fashion, the modular package can be mounted onto the base board in such a way that the overall thickness of the device can be reduced by way of the at least one surface mount device sinking into the hole as the modular package is mounted onto the base board.

Those skilled in the art will comprehend that the steps of the process described in blocks 702 and 704 may be performed on a plurality of modular packages, such that each of the plurality of packages is tested and its functional characteristics are known. Thereafter, some of the modular packages may be mounted in one configuration as described in blocks 706 and 708, and other ones of the modular packages may be mounted in a different configuration as described in blocks 710 and 712. In this way, the number of process steps required to manufacture end products having different configurations is reduced. Further, the steps described in blocks 702 and 704 may be done at a manufacturer, after which the resultant modular packages may be utilized by different entities which may perform either one of the process steps described in blocks 706 and 708; or those described in blocks 710 and 712. In either case, the amount of testing required to result in a plurality of configurations can be substantially reduced.

In the foregoing specification, certain representative aspects of the invention have been described with reference to specific examples. Various modifications and changes may be made, however, without departing from the scope of the present invention as set forth throughout the specification. The specification and figures are illustrative, rather than restrictive, and modifications within the scope of the present disclosure are intended to be included within the scope of the invention. Accordingly, the scope of the invention should be determined by the claims and their legal equivalents rather than by merely the examples described.

For example, the steps recited in any method or process claims may be executed in any order and are not limited to the specific order presented in the claims. Additionally, the components and/or elements recited in any apparatus claims may be assembled or otherwise operationally configured in a variety of permutations and are accordingly not limited to the specific configuration recited in the claims.

Furthermore, certain benefits, other advantages, and solutions to problems have been described above with regard to particular examples; however, any benefit, advantage, solution to a problem, or any element that may cause any particular benefit, advantage, or solution to occur or to become more pronounced is not to be construed as a critical, required, or essential feature or component of any or all the claims.

As used herein, the terms "comprise," "comprises," "comprising," "having," "including," "includes" or any variation thereof, are intended to reference a non-exclusive inclusion, such that a process, method, article, composition or apparatus that comprises a list of elements does not include only those elements recited, but may also include other elements not expressly listed or inherent to such process, method, article, composition, or apparatus. Other combinations and/or modifications of the above-described structures, arrangements, applications, proportions, elements, materials, or components used in the practice of the present invention, in addition to those not specifically recited, may be varied or otherwise particularly adapted to specific environments, manufacturing specifications, design parameters, or other operating requirements without departing from the general principles of the same.

Moreover, reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. A modular package comprising:
a board comprising a first surface and a second surface opposing the first surface,
wherein the first surface comprises a plurality of connection pads located at a periphery of the board and configured to enable surface mounting of the board to a base board,
wherein the board and the plurality of connection pads are tested to enable direct surface mounting of the modular package onto the base board, and
wherein the board and connection pads are further tested to enable surface mounting of the modular package onto the base board utilizing a spacer between the connection pads and the base board.

2. The modular package of claim 1, further comprising the spacer,
wherein the spacer comprises a first plurality of connection pads on a first side configured to be electrically coupled to the connection pads on the board, and
wherein the spacer comprises a second plurality of connection pads on a second side for surface mounting the spacer to the base board.

3. The modular package of claim 2, wherein the spacer is configured to provide a gap between the board and the base board for accommodating at least one surface mount device mounted on the first surface of the board.

4. The modular package of claim 3, further comprising at least a second surface mount device mounted on an opposing surface of the base board opposite to the gap.

5. The modular package of claim 3, wherein the spacer comprises a first segment configured to be positioned adjacent to a first edge of the at least one surface mount device.

6. The modular package of claim 5, wherein the spacer further comprises a second segment configured to be positioned adjacent to a second edge of the at least one surface mount device.

7. The modular package of claim 6, wherein the second edge is opposite to the first edge.

8. The modular package of claim 6, wherein the second edge is adjacent to the first edge, such that the first segment and the second segment are joined at a corner.

9. The modular package of claim 8, wherein the spacer further comprises a third segment configured to be positioned adjacent to a third edge of the at least one surface mount device.

10. The modular package of claim 9, wherein the spacer is configured to substantially surround the at least one surface mount device such that the gap is a substantially closed gap.

11. The modular package of claim 2, wherein the base board is configured to be an RF shield for shielding at least one surface mount device mounted on the first surface of the board.

12. The modular package of claim 11, wherein the base board comprises a ground plane for providing the RF shield.

13. The modular package of claim 1, wherein the plurality of connection pads comprise at least one ball grid array.

14. The modular package of claim 1, wherein the base board comprises a hole for accommodating at least one surface mount device on the first surface of the board when the modular package is directly surface mounted onto the base board.

15. The modular package of claim 14, further comprising an RF shield for shielding the at least one surface mount device on the first surface of the board.

16. The modular package of claim 15, wherein the RF shield is mounted onto the first surface of the board and configured to fit into the hole in the base board when the modular package is directly surface mounted onto the base board.

17. The modular package of claim 1, wherein the board is configured to enable surface mounting of at least one device on the first surface of the board, and at least one device on the second surface of the board.

18. The modular package of claim 17, further comprising an RF shield for shielding the at least one device mounted on the second surface of the board.

19. An apparatus comprising:
means for directly mounting an integrated system-on-chip, comprising at least one surface mount device on a first surface of a board, onto a surface of a base board, such that the at least one surface mount device is in a hole in the base board;
means for providing a gap between the surface of the base board and the at least one surface mount device such that the at least one surface mount device is in the gap when the integrated system-on-chip is mounted onto the surface of the base board without the hole in the base board; and
means for testing the board and a plurality of connection pads to enable direct mounting of the at least one surface mount device on the base board.

20. A method of mounting a modular package onto a base board, comprising:
coupling a spacer to a first surface of the modular package; and
coupling the spacer to a first surface of the base board, such that the spacer forms a gap between the first surface of the modular package and the first surface of the base board for accommodating at least one surface mount device mounted on the first surface of the modular package,
wherein the modular package is tested to enable directly mounting onto a second base board having a hole for accommodating the at least one surface mount device mounted on the first surface of the modular package, without utilizing the spacer.

* * * * *